(12) United States Patent
Hirata et al.

(10) Patent No.: US 7,436,068 B2
(45) Date of Patent: Oct. 14, 2008

(54) COMPONENTS FOR FILM FORMING DEVICE

(75) Inventors: Akisuke Hirata, Chiba-ken (JP); Shinji Isoda, Chiba-ken (JP); Yutaka Kadowaki, Chiba-ken (JP); Katsuhiko Mushiake, Tokyo (JP)

(73) Assignee: Ulvac, Inc., Kanagawa (JP)

( * ) Notice: Subject to any disclaimer, the term of this patent is extended or adjusted under 35 U.S.C. 154(b) by 0 days.

(21) Appl. No.: 10/538,087

(22) PCT Filed: Jan. 22, 2004

(86) PCT No.: PCT/JP2004/000540

§ 371 (c)(1),
(2), (4) Date: Nov. 21, 2005

(87) PCT Pub. No.: WO2004/065654

PCT Pub. Date: Aug. 5, 2004

(65) Prior Publication Data

US 2006/0144418 A1    Jul. 6, 2006

(30) Foreign Application Priority Data

Jan. 23, 2003  (JP) .............................. 2003-015266

(51) Int. Cl.
*H01L 23/48* (2006.01)
*H01L 29/40* (2006.01)
(52) U.S. Cl. ...................... 257/774; 257/621
(58) Field of Classification Search ................. 257/621, 257/774
See application file for complete search history.

(56) References Cited

U.S. PATENT DOCUMENTS

| 5,628,839 | A | 5/1997 | Saso et al. |
| 6,207,553 | B1 * | 3/2001 | Buynoski et al. ............ 438/622 |
| 6,236,115 | B1 * | 5/2001 | Gaynes et al. .............. 257/774 |

FOREIGN PATENT DOCUMENTS

| JP | 63-66901 B2 | 12/1988 |
| JP | 5-230624 A | 9/1993 |
| JP | 8-277460 | 10/1996 |

\* cited by examiner

*Primary Examiner*—Kiesha L Rose
(74) *Attorney, Agent, or Firm*—Arent Fox LLP

(57) ABSTRACT

Herein disclosed are a component of a film-forming device, in which a thin films is formed on a substrate using a film-forming material, whose surface structure makes any breakage, peeling off and/or falling off of a film adhered to the component quite difficult, while the structure permits easy removal of such an adhered film within a short period of time when cleaning the component as sell as a method for cleaning the component. A large number of through holes each extending from the back face to the top face of the component are formed for the penetration of a cleaning solution into the boundary between the component and a film of the film-forming material adhered to the surface of the component and formed during the formation of the foregoing thin film. This easily allows the peeling off and removal of the film adhered to the component within a short period of time as compared when the adhered film is dissolved only from the surface thereof.

3 Claims, 3 Drawing Sheets (a)

COMPONENTS FOR FILM FORMING DEVICE

TECHNICAL FIELD OF THE INVENTION

The present invention relates to a component of a film-forming device for forming a variety of thin films consisting of film-forming materials on substrates and a method for cleaning the components.

BACKGROUND ART

Semiconductor products used in, for instance, LSI (large scale integrated circuit), a solar cell and a liquid crystal plasma display are formed in a film-forming device wherein thin films are formed on a substrate using a film-forming material according to a variety of film-forming methods such as vapor deposition, sputtering, CVD and other film-forming techniques.

The film-forming material is also adhered to the surface of components of film-forming device such as a deposition-inhibiting plate, for instance, a mask for substrates and a frame for supporting wafers, during the thin film-forming process.

When such film-forming treatments are repeated while exchanging substrates in the same film-forming device, the foregoing film-forming material adhered to such components increases its thickness because of the accumulation thereof and the deposited film may be broken, peeled off and may fall off from the components at a certain point of time. This becomes a cause of dust-generation and the dust may be adhered to the substrate on which a film is just in course of formation and may impair the desired characteristic properties of the resulting film. This would in turn reduce the yield of the semiconductor products thus produced.

Under such circumstances, there has been adopted, for instance, a washing or cleaning method in which components having films adhered thereto are immersed in a cleaning solution as a means for removing the foregoing adhered film.

The foregoing cleaning requires the interruption of the film-forming device before the adhered film is broken, peeled off and/or falls off, but it is quite difficult to correctly ascertain the instance when the adhered film is broken, peeled off and/or falls off. On the other hand, if such components are frequently washed without any confirmation of the instance when the Adhered film is broken, peeled off and/or falls off, a problem arises such that the operating efficiency of the film-forming device is considerably reduced.

There have conventionally been proposed components having a surface structure as shown in the attached FIG. 3, which would make any breakage, peeling off and/or falling off of an adhered film difficult, even when the adhered film is thick and which is disclosed in Japanese Un-Examined Patent Publication Hei 8-277460. The use of such a component having the foregoing structure would permit the solution of the foregoing problem of the breakage, peeling off and/or falling off of the adhered film even when the film-forming material is deposited on the component to a certain thickness and the elimination of such frequent cleaning of the components and therefore, the operational efficiency of the film-forming device has thus been substantially improved.

FIG. 3(a) attached hereto shows a basic material 31 constituting a component of a film-forming device, (hereunder simply referred to as "component"), whose surface is roughened according to a shot blasting technique in which the surface of the basic material is bombarded with steel balls having a small diameter or a glass bead-blasting technique in which glass beads are impacted against the surface thereof. The unevenness of the surface would permit an increase in the surface area of the basic material 31, the adhesive force of the film d adhered to the component increases and this accordingly permit the prevention of any breakage, peeling off and/or falling off of the adhered film d.

FIG. 3(b) attached hereto shows a basic material 32 constituting a component whose surface is roughened according to a mechanical processing method such as cutting and embossing techniques. In this case, the surface of the basic material 32 undergoes deformation in response to the stress applied onto the adhered film d and liable to cause peeling off of the film to thus relieve the stress. Therefore, any breakage, peeling off and/or falling off of the adhered film d can be prevented.

FIG. 3(c) attached hereto shows a basic material 33, which is first subjected to blasting as has been described above to thus give roughened surface and then coated with a tender metal to form a layer 34 on the surface of the basic material 33. Thus, the stress, which acts on the film d adhered to the component to thus cause breakage, peeling off and/or falling off thereof, can be relaxed because of the presence of such a tender metal layer 34 and accordingly, the latter permits the prevention of any breakage, peeling off and/or falling off of the film d.

When repeating such a film-forming treatment over considerable times, the film adhered to the component is, after all, broken, peeled off and/or falls off from the component, even when using the conventional component having the foregoing structure and accordingly, the component should be cleaned in order to reuse or recycle the same.

However, the component has such a structure, which makes any breakage or peeling off and/or falling off of the film adhered thereto, difficult. For this reason, it takes a long period of cleaning time to completely remove the film adhered to the component through the dissolution thereof using a cleaning solution and this in turn results in the substantial reduction of the operational efficiency of the film-forming device.

Moreover, the component per se is also immersed in the cleaning solution over a long period of time since a long period of time is required for the removal of the film adhered to the component and the cleaning solution may thus deteriorate the component.

In case where a long period of time is required for the cleaning, the component may be replaced with a fresh one. In case of, for instance, a mask for substrates whose size has gradually been increased in response to the need for a large-sized liquid crystal image plane, however, the frequent exchange thereof would instead result in an increase in the cost and labor for the production of thin films. Therefore, there has strongly been desired for the development of a technique, which permits the removal of such a film adhered to the component through cleaning and which makes it possible to reuse the component.

Accordingly, it is an object of the present invention to solve the foregoing problems and more specifically to provide a component for a film-forming device, whose surface structure makes any breakage, peeling off and/or falling off of a film adhered to the component difficult, while the structure permits easy removal of such an adhered film within a short period of time when cleaning the component.

DISCLOSURE OF THE INVENTION

The component of a film-forming device, according to the present invention, in which a thin film is formed on a substrate using a film-forming material, permits the solution of the foregoing problems and it is characterized in that a large number of through holes each extending from the back face to the top face of the component are formed for the penetration of a cleaning solution into the boundary between the component and a film of the film-forming material adhered to the surface of the component and formed during the formation of the foregoing thin film.

When the foregoing component is immersed in a cleaning solution, the structure thereof would permit the dissolution of the adhered film not only from the top face thereof, but also from the back face thereof or the boundary between the component and the adhered film, since the cleaning solution likewise comes in contact with the back face of the adhered film through the foregoing through holes. Therefore, the adhered film can be removed from the component prior to the complete dissolution of the same.

However, in the initial thin film-forming stage wherein any film of the film-forming material has not yet been adhered to the component, particles of the film-forming material may penetrate into the through holes or the plasma generated during the film-forming step may penetrate into the through holes to thus deposit a film adhered to the body of the device to which the component is attached.

In this respect, for the prevention of any penetration, into the through holes, of such particles of a film-forming material or plasma thus generated, the through holes is so designed that they have a diameter, which can inhibit the penetration of any particle of the film-forming material or the plasma thereof into the through holes or the foregoing through holes are formed in such a manner that they are in the optically blinded condition with respect to the surface of the component, for instance, the through holes are not vertical to the surface of the component, but are tilted towards the horizontal direction.

Incidentally, when a layer consisting of a metal film easily soluble in a cleaning solution is formed on the surface of the component according to a method such as thermal spraying, vapor deposition, sputtering, plating and lamination techniques, the adhered film is deposited on this layer.

In this case, the cleaning solution penetrates into the adhered film not only through the edges of the layer, but also through the through holes and thus, the adhered film can be peeled off from the component within a short period of time.

In this connection, the layer serves as a cap, which can inhibit the penetration of any particle of the film-forming material or the plasma thereof into the through holes during the film-forming operation.

The method for cleaning a component of a film-forming device according to the present invention is characterized in that it comprises the step of immersing, in a cleaning solution, a component having a film consisting of a film-forming material adhered to the surface thereof, wherein the component is a member selected from the group consisting of one having a large number of through holes extending from the back face to the top face of the component; one whose through holes are so designed that they have a diameter capable of inhibiting the penetration of any particle of a film-forming material or the plasma thereof into the through holes; one whose through holes are formed in such a manner that they are not vertical to the surface of the component, but are titled towards the horizontal direction; and one having a layer consisting of a metal film easily soluble in a cleaning solution formed on the surface thereof.

According to this method, the cleaning solution in which the component of the film-forming device is immersed penetrates into the adhered film not only through the top face thereof, but also through the back face thereof because of the presence of the through holes to thus dissolve the film and to peel off the same from the component.

BRIEF DESCRIPTION OF THE DRAWINGS

FIG. 2(a) is a cross sectional view showing an embodiment wherein the through holes thereof are so designed that they have a diameter capable of inhibiting the penetration of any particle of a film-forming material or plasma thereof into the through holes; FIG. 2(b) is a cross sectional view showing an embodiment wherein the through holes thereof are formed in such a manner that they are not vertical to the surface, but are tilted towards the horizontal direction; and FIG. 2(c) is a cross sectional view showing an embodiment wherein a layer consisting of a metal film easily soluble in a cleaning solution is formed on the surface of the basic material.

FIG. 3(a) is a cross sectional view showing an embodiment of the component whose surface is subjected to a blasting treatment; FIG. 3(b) is a cross sectional view showing an embodiment of the component in which the surface thereof is roughened by a mechanical processing method such as cutting or embossing; and FIG. 3(c) is a cross sectional view showing an embodiment of the component in which a layer of a tender metal is formed on the surface thereof.

BEST MODE FOR CARRYING OUT THE INVENTION

Figure 1:
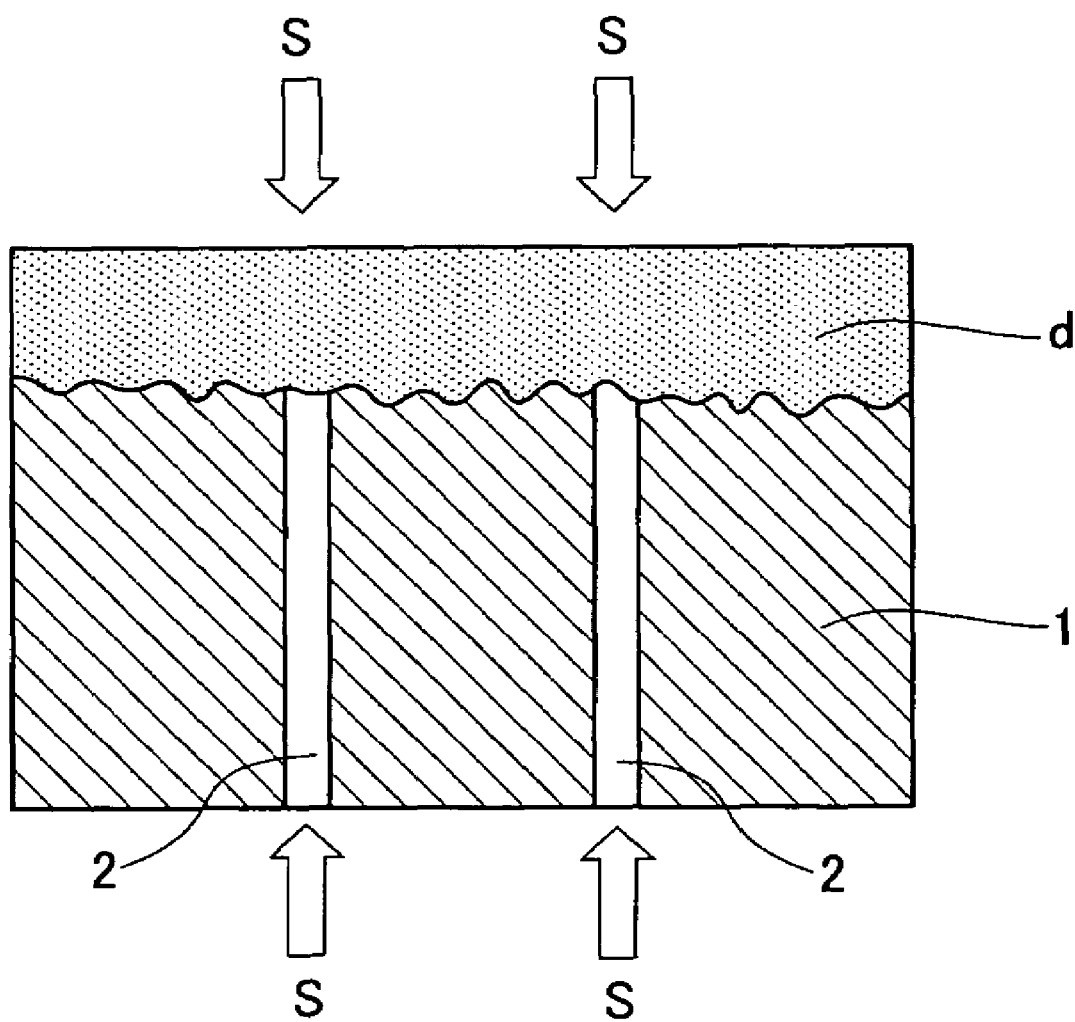
FIG. 1 is a partially expanded cross sectional view of a component according to the present invention.

Referring to FIG. 1, there is shown, in an enlarged scale, a basic material 1 which is usable to form components in film-forming devices. The components which can be formed by the basic material 1 may include a mask for substrate in a film-forming device or a frame for supporting wafer.

When a thin-film is formed from a film-forming material on a substrate in the film-forming device, an adhered film d may be formed even over the component of the film-forming device other than the substrate.

When such film-forming treatments are repeated while exchanging substrates in the same film-forming device, the foregoing adhered film d increases its thickness because of the accumulation thereof and the deposited film may be broken, peeled off and may fall off from the components at a certain point of time. This becomes a cause of dust-generation and the dust may be adhered to the substrate on which a film is just in course of formation and may impair the desired characteristic properties of the resulting film.

To remove this adhered film d, for example, the basic material 1 may be immersed in a cleaning solution S. However, such a cleaning solution S can remove the adhered film d only starting from the surface of a component. Thus, more time was taken in the entire removal of the adhered film d. When the surface structure of the basic material 1 makes any breakage, peeling off and/or falling an adhered film 1 difficult and if the cleaning solution S is used to dissolve the adhered film d only starting from the surface of the component, it could not but be waited for the adhered film d to be entirely dissolved by the cleaning solution S for removal of the adhered film d since the adhered film d will scarcely be separated from the surface of the component during the cleaning step.

If the basic material 1 is immersed in the cleaning solution S for a long time until the adhered film d is entirely dissolved, the basic material 1 may probably be damaged by the cleaning solution S.

To overcome such a problem, the present invention forms a number of through holes 2 in the basic material 1. When the foregoing component is immersed in a cleaning solution S, the structure thereof would permit the dissolution of the adhered film d not only from the top face thereof, but also from the back face thereof or the boundary between the component and the adhered film d, since the cleaning solution likewise comes in contact with the back face of the adhered film d through the through holes 2.

By providing the through holes 2 in the basic material 1, the cleaning solution S can dissolve and separate the adhered film d from the interface between the adhered film d and the basic material 1 before the adhered film d is entirely dissolved by the cleaning solution S. Therefore, the present invention is advantageous in that the adhered film d can easily and simply be dissolved for a time period which is smaller than time period that would be taken by the prior art to dissolve and remove the adhesion fluid d only starting from the surface of the component.

Since the adhered film d can be removed for a shorter time period than that of the prior art, the time period during which the basic material 1 is immersed in the cleaning solution S can be reduced, resulting in less damage to the basic material 1 by the cleaning solution S. The number of through holes 2 is especially limited unless it does not damage the strength of the basic material 1. However, the above-mentioned advantage can be provided, for example, if the distance between two adjacent through holes 2 is within the range between 3 cm and 5 cm.

Now, if the particles of a material used to form the adhered film d or plasma enter the through holes 2, it might accumulate the adhered film d on the main body of the film-forming device on which the components are mounted.

It is thus necessary to provide a structure of preventing the particles of the film-forming material and the plasma from entering the through holes 2.

Figure 2:
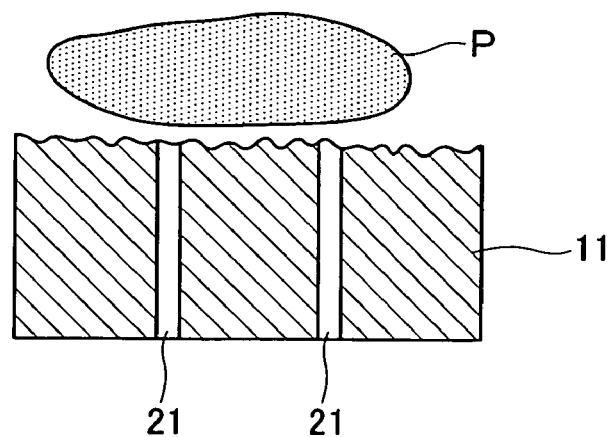
FIG. 2 is a partially expanded cross sectional view showing a component having a structure whose through holes are so designed that they have a diameter capable of inhibiting the penetration of, for instance, any particle of a film-forming material into the through holes.
Figure 2:
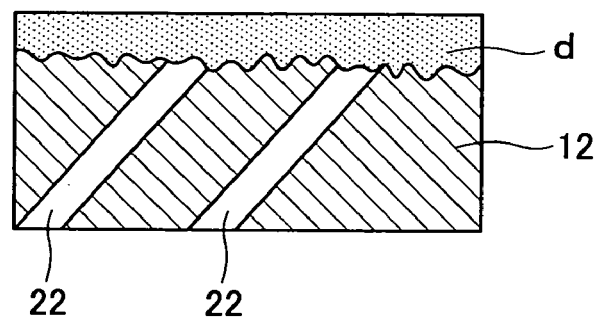
Figure 2:
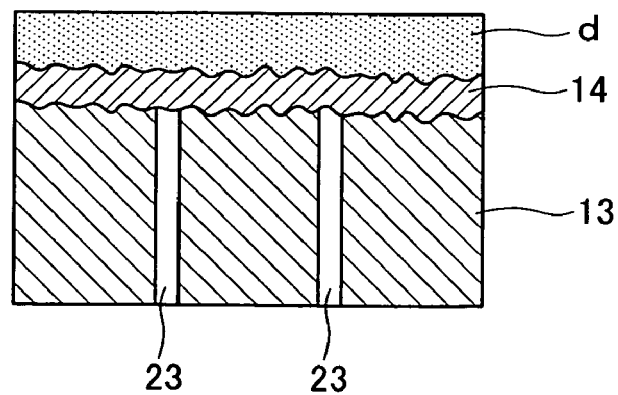
Figure 3:
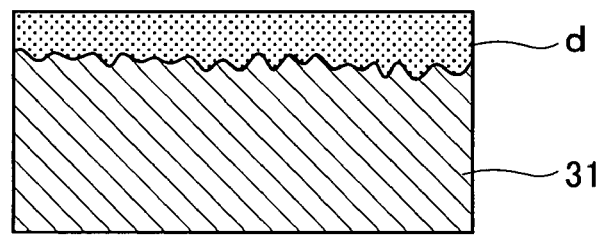
FIG. 3 is a partially expanded cross sectional view showing a conventional component having a surface structure in which any adhered film is hardly broken, peeled off and/or fall off and more specifically.
Figure 3:
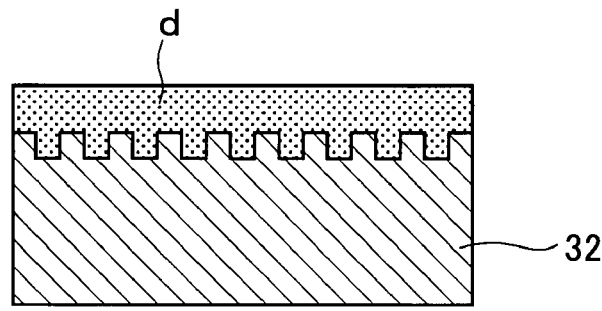
Figure 3:
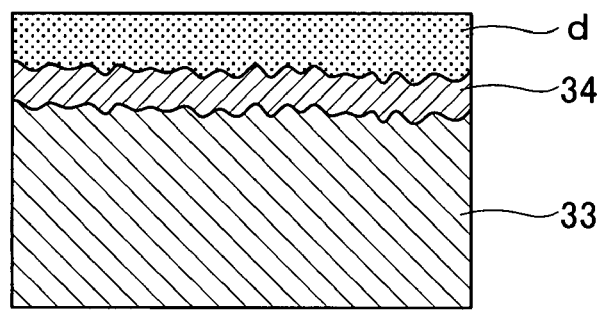

FIGS. 2(a)-(c) show enlarged cross-sections of some embodiments of the present invention, each of which has a structure for preventing the particles of the film-forming material and the plasma from entering the through holes 2. However, the present invention is not limited to such forms unless they depart from the spirit and scope of the invention.

The surfaces of basic materials 11 and 12 shown in FIGS. 2(a) and (b) are blast-finished, but may have any other surface structure.

Referring to FIG. 2(a), the diameter of each through hole 21 is set 0.8 mmf so that the plasma P will not enter or pass through the through hole 21.

By providing the through hole 21 having such a diameter, the plasma P cannot enter or pass through the through hole 21.

Referring to FIG. 2(b), through hole 22 are formed in such a manner that they are in the optically blinded condition with respect to the surface of the component, for instance, the through hole 22 are not vertical to the surface of the component, but are tilted towards the horizontal direction.

If a component formed from the basic material 12 having such through holes 22 is used, during formation of a thin-film on a substrate, the particles of the film-forming material or the plasma enter the through holes 22 through their top openings and then impact the inner walls of the through holes 22. Therefore, the particles or plasma cannot almost enter the interior of the through holes 22. This can prevent the adhered film d from accumulating on the main body of the film-forming device on which the components are mounted.

Referring to FIG. 2(c), there is shown the top face of a basic material 13 which is formed by spraying a layer 14 comprising a metal film having a property of easily-soluble in the cleaning solution.

In this connection, this layer 14 serves as a cap, which can inhibit the penetration of any particle of the film-forming material or the plasma thereof into the through hole 12 during the film-forming operation.

The adhered film d is deposited on the aforementioned layer 14. This layer 14 functions to prevent the adhered film d from being broken, peeled off and/or falls off from the substrate by reducing broking/peeling off stresses applied to the adhered film d during formation of the film on the substrate. If the basic material 13 is immersed in the cleaning solution S, however, the layer 14 responds to the cleaning solution S and is dissolved by the cleaning solution S faster than the basic material 13, resulting in separation of the adhered film d from the basic material 13.

Although the cleaning solution S has penetrated the substrate only through the edges of the layer 14 in the prior art, the through holes 23 can cause the cleaning solution S to reach various places in the layer 14. Thus, time required to separate the adhered film d can be reduced in comparison with the prior art.

INDUSTRIAL APPLICABILITY

As described, the component for the film-forming device according to the present invention and the method of cleaning the component can more easily and simply remove the adhered film for a reduced time period in comparison with the prior art in which the adhered film would be dissolved only starting from the surface thereof, for causing the cleaning solution to enter an interface between the component and the adhered film of the aforementioned film-forming material attached to the surface of the component on formation of the thin-film, by providing a number of through holes extending from the top face of each component to the bottom face of the same. Therefore, the component according to the present invention is suitable for use in the film-forming device for forming a thin-film from a film-forming material on a substrate through any process such as vapor deposition, sputtering, CVD or others, as an anti-adhesion sheet such as a mask for substrate or a frame for supporting wafer.

What is claimed is:

1. A component of a film-forming device in which a thin film is formed on a substrate in the device using a film-forming material, the component of the film-forming device comprising:

a body having a back face and a top face and a large number of through holes each extending from the back face to the top face formed therein, wherein one of the back face and the top face includes a surface on which the thin film adheres during use, and the through holes provide access from the other one of the back face and the top face to the thin film adhered on the surface, whereby a cleaning solution penetrates into a boundary between the surface and the thin film adhered thereon during cleaning thereof; and wherein the through holes have a diameter smaller than a size of any particle of the film-forming material or a plasma thereof, thereby preventing penetration of any particle of the film-forming material or the plasma thereof into the through hole.

2. The component of a film-forming device according to claim 1, wherein the through holes are formed in such a manner that they are not perpendicular to the surface of the body of the component.

3. The component of a film-forming device according to claim 1, further comprising a layer consisting of a metal film easily soluble in the cleaning solution, the metal film being provided on the surface of the component prior to adherence of the thin film thereon during use.

* * * * *